(12) United States Patent
Hirata et al.

(10) Patent No.: US 10,771,034 B2
(45) Date of Patent: Sep. 8, 2020

(54) CONDUCTIVE PATH WITH NOISE FILTER

(71) Applicants: AUTONETWORKS TECHNOLOGIES, LTD., Yokkaichi-shi, Mie (JP); SUMITOMO WIRING SYSTEMS, LTD., Yokkaichi-shi, Mie (JP); SUMITOMO ELECTRIC INDUSTRIES, LTD., Osaka-shi, Osaka (JP)

(72) Inventors: Keiji Hirata, Yokkaichi (JP); Takeshi Aizawa, Yokkaichi (JP)

(73) Assignees: AUTONETWORKS TECHNOLOGIES, LTD., Mie (JP); SUMITOMO WIRING SYSTEMS, LIMITED, Mie (JP); SUMITOMO ELECTRIC INDUSTRIES, LTD., Osaka (JP)

(*) Notice: Subject to any disclaimer, the term of this patent is extended or adjusted under 35 U.S.C. 154(b) by 119 days.

(21) Appl. No.: 16/095,164

(22) PCT Filed: Apr. 4, 2017

(86) PCT No.: PCT/JP2017/014010
§ 371 (c)(1),
(2) Date: Oct. 19, 2018

(87) PCT Pub. No.: WO2017/187902
PCT Pub. Date: Nov. 2, 2017

(65) Prior Publication Data
US 2019/0149116 A1   May 16, 2019

(30) Foreign Application Priority Data

Apr. 25, 2016   (JP) .................................. 2016-086803

(51) Int. Cl.
*H03H 7/01* (2006.01)
*H05K 5/02* (2006.01)
(Continued)

(52) U.S. Cl.
CPC ........... *H03H 7/0115* (2013.01); *B60R 16/02* (2013.01); *B60R 16/0215* (2013.01);
(Continued)

(58) Field of Classification Search
CPC ... H03H 1/0007; H03H 7/0115; H05K 5/0247
(Continued)

(56) References Cited

FOREIGN PATENT DOCUMENTS

| JP | 2010-126043 A | 6/2010 |
| JP | 5850355 B1 | 2/2016 |

(Continued)

OTHER PUBLICATIONS

Jun. 13, 2017 International Search Report issued in International Patent Application PCT/JP2017/014010.

*Primary Examiner* — Rakesh B Patel
(74) *Attorney, Agent, or Firm* — Oliff PLC

(57) ABSTRACT

A conductive path with noise filter that includes a plurality of conductive path main bodies; a plurality of insulating layers that surround respective outer circumferences of the conductive path main bodies; a plurality of conductors that are provided with the insulating layers being sandwiched between the conductors and the conductive path main bodies and form respective capacitors; a plurality of inductors that are connected to the respective conductors; and an electrical connector that includes a plurality of fitting portions into which the respective inductors can be fitted and that is attached to an electrical connection holder.

3 Claims, 2 Drawing Sheets

(51) Int. Cl.
*H03H 1/00* (2006.01)
*B60R 16/02* (2006.01)
*H01B 7/00* (2006.01)
*H02M 7/00* (2006.01)
*H03H 7/09* (2006.01)
*H05K 9/00* (2006.01)

(52) U.S. Cl.
CPC .......... *H01B 7/0018* (2013.01); *H02M 7/003* (2013.01); *H03H 7/09* (2013.01); *H05K 5/0247* (2013.01); *H05K 9/0049* (2013.01); *H03H 1/0007* (2013.01); *H03H 2001/0092* (2013.01)

(58) Field of Classification Search
USPC .......................... 333/175, 185, 236, 243, 183
See application file for complete search history.

(56) References Cited

FOREIGN PATENT DOCUMENTS

| | | | |
|---|---|---|---|
| JP | 5850356 | B1 | 2/2016 |
| JP | 5850357 | B1 | 2/2016 |

CONDUCTIVE PATH WITH NOISE FILTER

This application is the U.S. National Phase of PCT/JP2017/014010 filed Apr. 4, 2017, which claims priority from JP 2016-086803 filed Apr. 25, 2016, the disclosure of which is incorporated herein by reference.

BACKGROUND

The present disclosure relates to a conductive path with noise filter.

JP 2010-126043A discloses a technology in which a wire harness including three-phase AC wires is arranged between a motor and an inverter device in an electric vehicle, the wire harness is surrounded by a braided wire in order to take a measure against noise produced by the wire harness, and the two ends of the braided wire are connected to a shielding case of the motor and a shielding case of the inverter device. Using the braided wire to shield the wire harness in this manner makes it possible to prevent noise produced by the motor, the inverter device, and the wire harness from affecting surrounding devices or circuits.

However, using this method of surrounding a wire harness with a braided wire, it is difficult to effectively reduce surge noise in a specific frequency band produced by the inverter device. Therefore, a noise filter is conceivable in which three coated electric wires that are each constituted by a conductive path main body surrounded by an insulating layer constitute three-phase AC wires, conductors are provided on the outer circumferences of the insulating layers to form capacitors between the conductive path main bodies and the conductors, and three inductors that are connected to the respective conductors are star-connected or delta-connected. With this noise filter, setting the electrostatic capacitances of the capacitors and the inductances of the inductors as appropriate makes it possible to effectively reduce surge noise in a specific frequency band due to LC resonance.

SUMMARY

A method for connecting the inductors through soldering is conceivable as a means for connecting the three inductors. However, a connection method including soldering is problematic in terms of workability, and therefore, an improvement of the method is called for.

An exemplary aspect of the disclosure improves the workability during the connection of inductors.

A conductive path with noise filter of the present disclosure includes: a plurality of conductive path main bodies; a plurality of insulating layers that surround respective outer circumferences of the conductive path main bodies; a plurality of conductors that are provided with the insulating layers being sandwiched between the conductors and the conductive path main bodies and form respective capacitors; a plurality of inductors that are connected to the respective conductors; and an electrical connection member including a plurality of fitting portions into which the respective inductors can be fitted.

When a plurality of inductors are connected, the inductors need only be fitted into the fitting portions of the electrical connection member and need not be soldered, and thus the workability is good.

DETAILED DESCRIPTION OF EMBODIMENTS

The conductive path with noise filter of the present disclosure may also have a configuration in which the electrical connection member is attached to an electrical connection holder, each of the inductors includes a connection conductor that can be fitted into the fitting portion, and a magnetic core that surrounds the connection conductor, and the magnetic cores are attached to the electrical connection holder. With this configuration, when the connection conductors are fitted into the fitting portions, the inductors are formed, and at the same time, the inductors are electrically connected.

The conductive path with noise filter of the present disclosure may include a connection holder that can hold the connection conductor and the conductor in a state in which the connection conductor and the conductor are connected. With this configuration, the connection conductors and the conductors can form a unit, and therefore, these members are easy to handle.

The conductive path with noise filter of the present disclosure may include a holding portion that is formed in the connection holder and that can hold the connection conductor, the conductor, the conductive path main body, and the insulating layer all together. With this configuration, in addition to making a unit of the connection conductors and the conductors, the conductive path main bodies and the insulating layers can form a unit, and therefore, these members are easy to handle.

The conductive path with noise filter of the present disclosure may also have a configuration in which a plurality of the connection holders are integrated via a coupling portion. With this configuration, the connection holders are integrated, and therefore, the handling is further facilitated.

Embodiment 1

Figure 1:
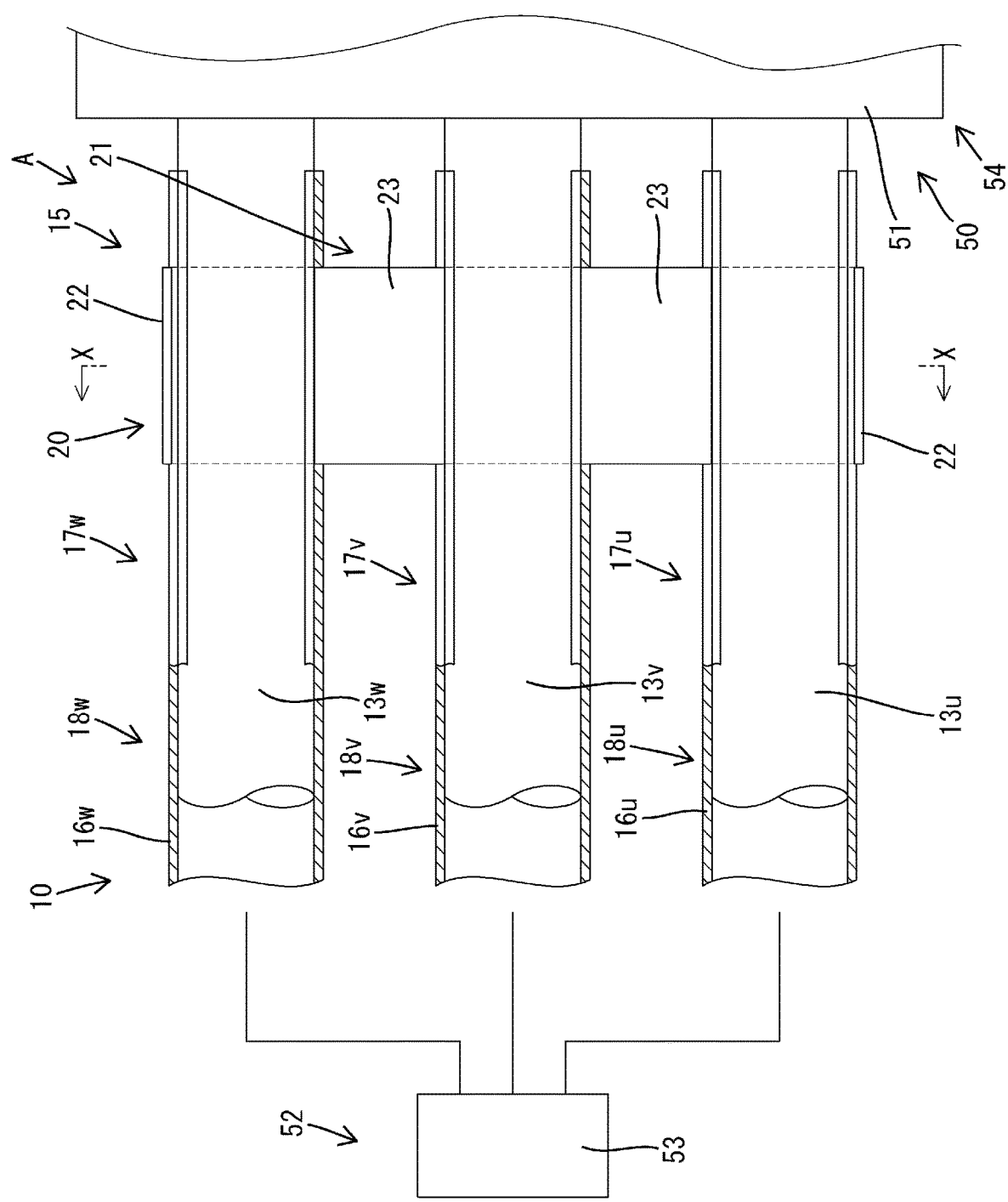
FIG. 1 is a plan view of a conductive path with noise filter of Embodiment 1.

Hereinafter, Embodiment 1 in which the present disclosure is embodied will be described with reference to FIGS. 1 and 2. A conductive path A with noise filter of Embodiment 1 is arranged between a motor 50 and an inverter device 52 mounted in an electric vehicle (not shown) such as an electric car or a hybrid car. In this electric vehicle, a motor case 51 that is a housing of the motor 50, an inverter case 53 that is a housing of the inverter device 52, and a shielding layer 45 that connects the cases 51 and 53 constitute a housing ground 54.

The conductive path A with noise filter includes a U-phase wire 11u("conductive path main body" in the claims), a V-phase wire 11v ("conductive path main body" in the claims), and a W-phase wire 11w ("conductive path main body" in the claims) that constitute a three-phase AC circuit 10, and a surge reducing noise filter 15, the shielding layer 45, a holding module 20, and an electrical connection module 31.

The U-phase wire 11u, the V-phase wire 11v, and the W-phase wire 11w are each constituted by a stranded wire made of metal (e.g., copper, a copper alloy, aluminum, or an aluminum alloy). The outer circumference of the U-phase wire 11u, the outer circumference of the V-phase wire 11v, and the outer circumference of the W-phase wire 11w are surrounded by a U-phase insulating coating 12u ("insulating layer" in the claims) made of a synthetic resin, a V-phase insulating coating 12v ("insulating layer" in the claims)

made of a synthetic resin, and a W-phase insulating coating 12w ("insulating layer" in the claims) made of a synthetic resin, respectively. The U-phase wire 11u and the U-phase insulating coating 12u make up one coated electric wire 13u, the V-phase wire 11v and the V-phase insulating coating 12v make up one coated electric wire 13v, and the W-phase wire 11w and the W-phase insulating coating 12w make up one coated electric wire 13w.

The U-phase wire 11u, the V-phase wire 11v, and the W-phase wire 11w are arranged in parallel. One end of each of the U-phase wire 11u, the V-phase wire 11v, and the W-phase wire 11w is connected to an inverter circuit (not shown) of the inverter device 52. The inverter circuit is accommodated inside the conductive inverter case 53, which has a shielding function. The other ends of the U-phase wire 11u, the V-phase wire 11v, and the W-phase wire 11w are connected to the windings (not shown) of the motor 50. The windings are accommodated inside the conductive motor case 51, which has a shielding function.

The noise filter 15 includes a U-phase conductor 16u ("conductor" in the claims), a V-phase conductor 16v ("conductor" in the claims), and a W-phase conductor 16w ("conductor" in the claims) These conductors 16u, 16v, and 16w are made of metal (e.g., copper, a copper alloy, aluminum, or an aluminum alloy) and have a sheet shape. The U-phase conductor 16u, the V-phase conductor 16v, and the W-phase conductor 16w are attached to only portions in the circumferential direction of the outer circumferences of the U-phase insulating coating 12u, the V-phase insulating coating 12v, and the W-phase insulating coating 12w, respectively. The conductor 16u, the conductor 16v, and the conductor 16w are provided over substantially the entire lengths of the insulating coating 12u, the insulating coating 12v, and the insulating coating 12w, respectively.

The U-phase conductor 16u is located such that the U-phase conductor 16u and the U-phase wire 11u are in proximity to each other and face each other with the U-phase insulating coating 12u being sandwiched therebetween. The U-phase wire 11u, the U-phase insulating coating 12u, and the U-phase conductor 16u constitute a U-phase coated conductor 18u. This U-phase coated conductor 18u functions as a U-phase capacitor 17u ("capacitor" in the claims) using the U-phase wire 11u and the U-phase conductor 16u as electrodes.

The V-phase conductor 16v is located such that the V-phase conductor 16v and the V-phase wire 11v are in proximity to each other and face each other with the V-phase insulating coating 12v being sandwiched therebetween. The V-phase wire 11v, the V-phase insulating coating 12v, and the V-phase conductor 16v constitute a V-phase coated conductor 18v. This V-phase coated conductor 18v functions as a V-phase capacitor 17v ("capacitor" in the claims) using the V-phase wire 11v and the V-phase conductor 16v as electrodes.

The W-phase conductor 16w is located such that the W-phase conductor 16w and the W-phase wire 11w are in proximity to each other and face each other with the W-phase insulating coating 12w being sandwiched therebetween. The W-phase wire 11w, the W-phase insulating coating 12w, and the W-phase conductor 16w constitute a W-phase coated conductor 18w. This W-phase coated conductor 18w functions as a W-phase capacitor 17w ("capacitor" in the claims) using the W-phase wire 11w and the W-phase conductor 16w as electrodes.

The end portions on the motor 50 side of the three coated conductors 18u, 18v and 18w are held by the holding module 20. The holding module 20 is obtained by integrating a supporter 21 that is a standalone component made of a material, such as a synthetic resin, having insulating properties and elasticity, and three connection conductors 26 having conductivity. The supporter 21 includes three connection holders 22 having an arc shape, and two coupling portions 23 having an arc shape. The inner circumferential portions of the connection holders 22 serve as holding portions 24 for holding the respective coated conductors 18u, 18v, and 18w in an elastically surrounded state.

Figure 2:
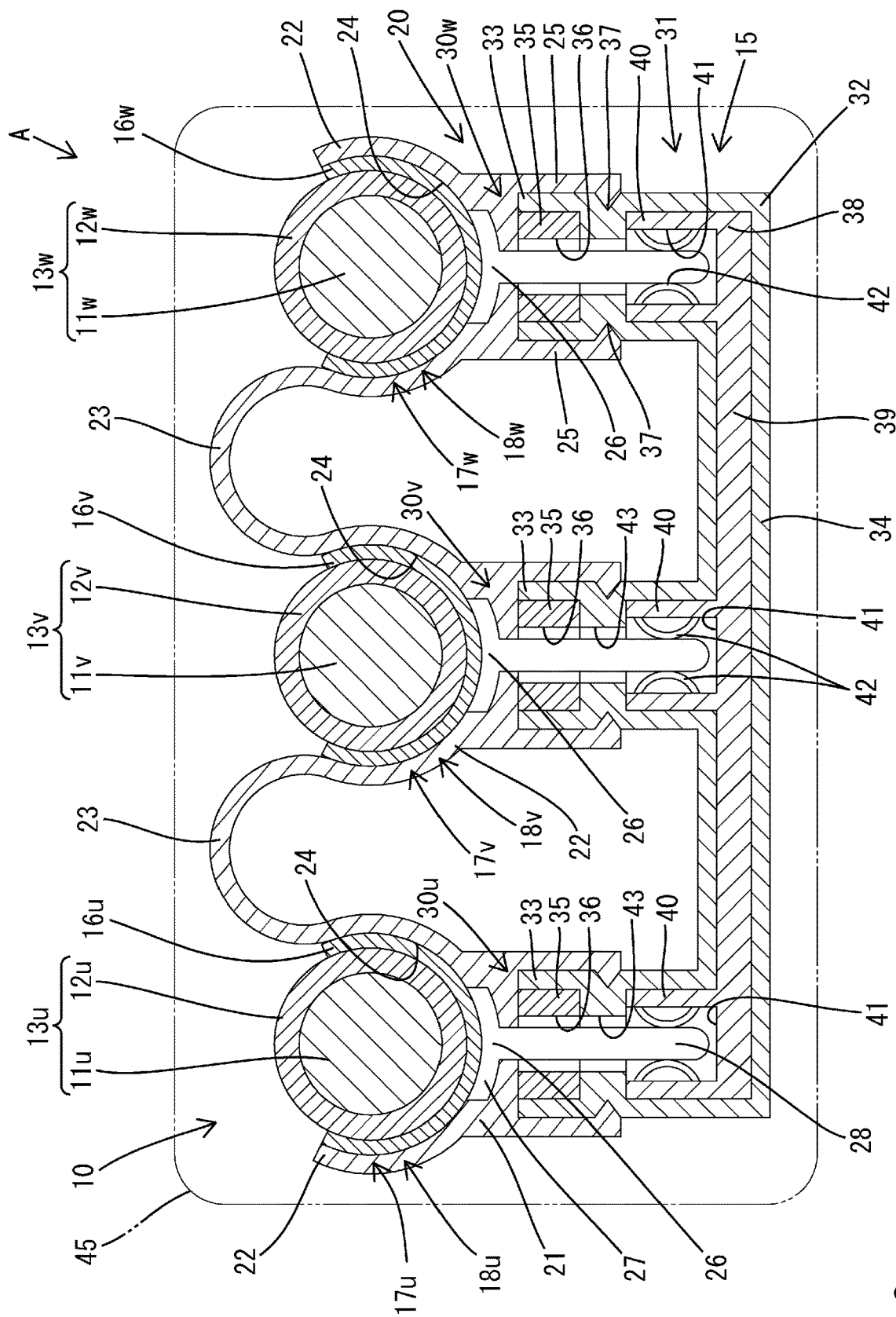
FIG. 2 is a cross-sectional view taken along line X-X in FIG. 1.

Two elastic locking pieces 25 spaced apart in a width direction (a direction orthogonal to the axial direction of the coated conductors 18u, 18v, and 18w; a left-right direction in FIG. 2) are formed in one piece at the central portion (lower end in FIG. 2) in the circumferential direction of the holding portion 24 (connection holder 22). The two elastic locking pieces 25 extend downward in a cantilever shape, and the lower end portions of the elastic locking pieces 25 have a projecting shape.

The three connection holders 22 are arranged with a constant pitch in the width direction with openings of the holding portions 24 being open upward. The two end portions in the circumferential direction of each of the coupling portions 23 couple the end portions in the circumferential direction of adjacent connection holders 22. Elastically deforming the coupling portions 23 makes it possible to change and adjust the positional relationship between the adjacent connection holders 22 or the orientations thereof relative to each other.

Each of the connection conductors 26 is integrated with the central portion in the circumferential direction of the connection holder 22 through insert molding or the like. The connection conductor 26 is a standalone component including a connection portion 27 in which the curvature of the inner circumferential surface is the same as that of the holding portion 24, and a leg portion 28 protruding from the outer circumferential surface of the connection portion 27. The connection portion 27 is embedded in the holding portion 24 (connection holder 22) such that the inner circumferential surface of the connection portion 27 is exposed on the inner circumferential surface of the holding portion 24. The leg portion 28 protrudes outward in the radial direction (downward in FIG. 2) from the outer circumferential surface of the connection holder 22. The connection conductors 26 are included in inductors 30u, 30v, and 30w, which will be described later.

The noise filter 15 includes three inductors 30u, 30v and 30w. The U-phase inductor 30u ("inductor" in the claims) is connected to the end portion on the motor 50 side of the U-phase conductor 16u, the V-phase inductor 30v ("inductor" in the claims) is connected to the end portion on the motor 50 side of the V-phase conductor 16v, and the W-phase inductor 30w ("inductor" in the claims) is connected to the end portion on the motor 50 side of the W-phase conductor 16w. The three inductors 30u, 30v and 30w are star-connected via an electrical connection member 38, which will be described later, and are connected to the motor case 51 (housing ground 54) via a housing connection wire (not shown). The inductors 30u, 30v, and 30w each include one connection conductor 26 and one magnetic core 35 having an annular shape. The magnetic core 35 is integrated with the electrical connection module 31, which will be described later.

The electrical connection module 31 includes an electrical connection holder 32 made of an insulating material, an electrical connection member 38 having conductivity, and the three magnetic cores 35. The electrical connection holder 32 includes three connecting portions 33 spaced apart in the width direction, and one linking portion 34 that links the lower end portions of the three connecting portions 33. The magnetic cores 35 are embedded in the upper end portions of the connecting portions 33 with their axes extending in the vertical direction. Central holes 36 of the magnetic cores 35 are open in the upper end surfaces of the connecting portions 33. Two locking recesses 37 are formed in both outer lateral surfaces in the width direction of the connecting portions 33.

The electrical connection member 38 is made of metal and includes a main body portion 39 extending in the width direction and three fitting portions 40 spaced apart in the width direction. The main body portion 39 links the lower end portions of the three fitting portions 40. Fitting spaces 41 that are open upward are formed inside the fitting portions 40, and elastic contact pieces 42 are accommodated in the fitting spaces 41. The electrical connection member 38 is embedded in the electrical connection holder 32. The main body portion 39 is accommodated in the linking portion 34. The three fitting portions 40 are accommodated in the respective lower end portions of the three connecting portions 33. A communication hole 43 through which the central hole 36 of the magnetic core 35 and the fitting space 41 are coaxially in communication is formed in the connecting portion 33.

The shielding layer 45 is a tubular metal member constituted by a braided wire or the like, for example. One end of the shielding layer 45 is located near the motor 50, and connected to the motor case 51 such that electrical conduction is established. The other end of the shielding layer 45 is located near the inverter device 52, and connected to the inverter case 53 such that electrical conduction is established. A space surrounded by the shielding layer 45 serves as a shielded space. The shielding layer 45 surrounds the three coated conductors 18$u$, 18$v$, and 18$w$, the holding module 20, and the electrical connection module 31 all together.

Next, the functions of this embodiment will be described. When the conductive path A with noise filter is fabricated, the end portions on the motor 50 side of the three coated conductors 18$u$, 18$v$, and 18$w$ are fitted into the three holding portions 24 of the holding module 20. At this time, the inner circumferential surfaces of the connection portions 27 of the connection conductors 26 are exposed on the respective inner circumferences of the holding portions 24, and therefore, the connection portions 27 and the conductors 16$u$, 16$v$, and 16$w$ are in areal contact in a state in which electrical conduction is established. As a result, the capacitors 17$u$, 17$v$, and 17$w$ are connected to the end portions on one side of the corresponding inductors 30$u$, 30$v$, and 30$w$, respectively.

Then, the holding module 20 holding the three coated conductors 18$u$, 18$v$, and 18$w$ is assembled to the electrical connection module 31. During the assembly, the leg portions 28 of the connection conductors 26 are inserted through the central holes 36 of the magnetic cores 35 and the communication holes 43 and inserted into the fitting portions 40 (fitting space 41), and then brought into contact with the elastic contact pieces 42. As a result, the leg portions 28 (i.e., end portions of the inductors 30$u$, 30$v$, and 30$w$ on a side opposite to the capacitor 17$u$, 17$v$, and 17$w$) of the three connection conductors 26 are connected via the electrical connection member 38, and the three inductors 30$u$, 30$v$, and 30$w$ are star-connected.

The elastic locking pieces 25 of the holding module 20 are locked to the locking recesses 37 of the electrical connection module 31, and the modules 20 and 31 are thus locked into an assembled state. The fabrication of the conductive path A with noise filter is thus completed. It should be noted that the fabrication procedure is not limited to the above-mentioned procedure, and the holding module 20 may also be assembled to the electrical connection module 31 first, after which the three coated conductors 18$u$, 18$v$, and 18$w$ are attached to the holding module 20.

The conductive path A with noise filter of Embodiment 1 includes the three conductive path main bodies (namely the U-phase wire 11$u$, the V-phase wire 11$v$, and the W-phase wire 11$w$), the three insulating layers (namely the U-phase insulating coating 12$u$, the V-phase insulating coating 12$v$, and the W-phase insulating coating 12$w$) that surround the respective outer surfaces of the conductive path main bodies, the three conductors (namely the U-phase conductor 16$u$, the V-phase conductor 16$v$, and the W-phase conductor 16$w$) that correspond to the respective three conductive path main bodies (namely the U-phase wire 11$u$, the V-phase wire 11$v$, and the W-phase wire 11$w$) with the insulating layers (namely the U-phase insulating coating 12$u$, the V-phase insulating coating 12$v$, and the W-phase insulating coating 12$w$) being sandwiched between the conductors and the conductive path main bodies, and the three inductors (namely the U-phase inductor 30$u$, the V-phase inductor 30$v$, and the W-phase inductor 30$w$) that are connected to the respective three conductors 16$u$, 16$v$, and 16$w$. The capacitors (namely the U-phase capacitor 17$u$, the V-phase capacitor 17$v$, and W-phase capacitor 17$w$) are formed by sandwiching the respective three insulating layers (the U-phase insulating coating 12$u$, the V-phase insulating coating 12$v$, and the W-phase insulating coating 12$w$) between the three conductors (namely the U-phase conductor 16$u$, the V-phase conductor 16$v$, and the W-phase conductor 16$w$) and the three conductive path main bodies (namely the U-phase wire 11$u$, the V-phase wire 11$v$, and the W-phase wire 11$w$).

It should be noted that the electrostatic capacitances of the capacitors 17$u$, 17$v$, and 17$w$ can be set as desired by selecting, as appropriate, the lengths of the conductors 16$u$, 16$v$, and 16$w$, the corresponding areas of the conductors 16$u$, 16$v$, and 16$w$ and the conductive path main bodies (namely the U-phase wire 11$u$, the V-phase wire 11$v$, and the W-phase wire 11$w$), the distances between the conductors 16$u$, 16$v$, and 16$w$ and the conductive path main bodies (namely the U-phase wire 11$u$, the V-phase wire 11$v$, and the W-phase wire 11$w$), the materials of the U-phase insulating coating 12$u$, the V-phase insulating coating 12$v$, and the W-phase insulating coating 12$w$, for example. The inductances of the inductors 30$u$, 30$v$, and 30$w$ can be set as desired by changing the materials, sizes, or the like of the magnetic cores 35. Depending on the settings of the electrostatic capacitances and inductances, surge noise in a specific frequency band can be reduced due to LC resonance.

The conductive path A with noise filter of Embodiment 1 includes, as a means for connecting the three inductors 30$u$, 30$v$, and 30$w$, the electrical connection member 38 including the fitting portions 40 into which the three respective inductors 30$u$, 30$v$, and 30$w$ can be fitted. When the three inductors 30$u$, 30$v$, and 30$w$ are connected, the inductors 30$u$, 30$v$, and 30$w$ need only be fitted into the fitting portions 40 of the electrical connection member 38, and thus need not be soldered. Therefore, the workability is good.

The electrical connection member 38 is attached to the electrical connection holder 32. The inductors 30$u$, 30$v$, and 30$w$ each include the connection conductor 26 that can be fitted into the fitting portion 40, and the magnetic core 35 that surrounds the connection conductor 26. The magnetic cores 35 are attached to the electrical connection holder 32. With this configuration, when the connection conductors 26 are fitted into the fitting portions 40, the inductor 30u, 30v, and 30w are formed, and at the same time, electrical conduction is established between the three inductors 30u, 30v, and 30w, thus making it possible to reduce man-hours.

In addition, the connection holders 22 that can each hold the connection conductor 26 and the conductor 16u, 16v, or 16w in a state in which the connection conductor 26 and the conductor 16u, 16v, or 16w are connected are provided, thus making it possible to form a unit of the connection conductors 26 and the conductors 16u, 16v, and 16w. This makes it easy to handle the connection conductors 26 and the conductors 16u, 16v, and 16w. Moreover, the connection holders 22 are each provided with the holding portion 24 that can hold the connection conductor 26, the conductor 16u, 16v, or 16w, the conductive path main body (namely the U-phase wire 11u, the V-phase wire 11v, or the W-phase wire 11w), and the insulating layer (namely the U-phase insulating coating 12u, the V-phase insulating coating 12v, or the W-phase insulating coating 12w) all together.

With this configuration, in addition to making a unit of the connection conductors 26 and the conductors 16u, 16v, and 16w, the conductive path main bodies (namely the U-phase wire 11u, the V-phase wire 11v, and the W-phase wire 11w) and the insulating layers (namely the U-phase insulating coating 12u, the V-phase insulating coating 12v, and the W-phase insulating coating 12w) can form a unit, and therefore, these members are easy to handle. Furthermore, the three connection holders 22 are integrated via the coupling portions 23, and therefore, the handling is further facilitated.

Other Embodiments

The present disclosure is not limited to the embodiment that has been described above with reference to the drawings, and embodiments such as those described below are also included in the technical scope of the present disclosure, for example.

(1) Although the plurality or connection holders are integrated via the coupling portions in the above-described embodiment, a configuration in which the plurality of connection holders are not coupled is also possible.

(2) Although each of the holding portions of the connection holders holds the connection conductor, the conductor, the conductive path main body, and the insulating layer all together in the above-described embodiment, the connection holder may also hold only the connection conductor and the conductor, or only the connection conductor, the conductor, and the insulating layer.

(3) Although the connection holders that each hold the connection conductor and the conductor in a state in which the connection conductor and the conductor are connected are provided in the above-described embodiment, a configuration in which such a connection holder is not provided is also possible.

(4) Although the inductors include the magnetic cores such as ferrite cores in the above-described embodiment, metal single-core wires or metal stranded wires may be shaped into a coil shape and used as the inductors.

(5) Although each of the inductors is arranged between the adjacent two coated conductors in the above-described embodiment, the inductor may also be arranged at a position that forms a triangle together with the adjacent two coated conductors.

(6) Although the inductors are accommodated inside the shielding layer in the above-described embodiment, the inductors may also be arranged outside the shielding layer.

(7) Although the inductors are arranged on only the motor side and connected to only the motor case in the above-described embodiment, inductors may also be provided on the inverter device side in addition to the inductors on the motor side, and connected to the inverter case.

(8) Although the flexible stranded wires having a circular cross section are used as the conductive path main bodies in the above-described embodiment, busbars that are not deformed easily, flat cables in which a plurality of electric wires are arranged in parallel, or the like may also be used.

(9) Although the number of the coated conductors constituting the conductive paths is three in the above-described embodiment, the number of the coated conductors constituting the conductive paths may also be two, or four or more.

(10) Although the three coated conductors constitute the three-phase AC circuit in the above-described embodiment, the present disclosure can also be applied to a circuit other than a three-phase AC circuit.

(11) Although each of the insulating layers is integrated with the outer circumference of the conductive path main body and included in the coated electric wire in the above-described embodiment, each of the insulating layers may also be integrated with the inner circumference of the conductor, or arranged between the outer circumference of the conductive path main body and the inner circumference of the conductor to be capable of being displaced relatively.

(12) Although each of the conductors corresponds to only a partial region of the outer circumference of the conductive path main body in a circumferential direction in the above-described embodiment, a configuration in which each of the conductors corresponds to the conductive path main body and surrounds the entire circumference thereof is also possible.

(13) Although sheet-like metal foils are use as the conductors in the above-described embodiment, tape-like metal foils, braided wires, metal busbars, metal stranded wires, metal single-core wires, core materials with a plated surface, conductive resins, conductive rubbers, or the like may also be used.

(14) Although the housing connection wire is connected to the motor case in the above-described embodiment, the housing connection wire may also be connected to not the motor case but the vehicle body directly.

(15) Although the shielding layer surrounds the plurality of conductive path main bodies all together in the above-described embodiment, a configuration in which such a shielding layer is not provided is also possible.

(16) Although the inductors are star-connected in the above-described embodiment, the inductors may also be delta-connected.

(17) Although the main body of the conductive path with noise filter is arranged between the motor and the inverter device in the above-described embodiment, the present disclosure can also be applied to a case where the conductive path with noise filter is to be connected to devices other than the motor and the inverter device.

The invention claimed is:
1. A conductive path with a noise filter comprising:
a plurality of conductive path main bodies;
a plurality of insulating layers that surround respective outer circumferences of the plurality of conductive path main bodies;
a plurality of conductors that are provided with the plurality of insulating layers being sandwiched respec- tively between the corresponding plurality of conductors and the plurality of conductive path main bodies to form respective capacitors;

a plurality of inductors that are connected to the respective plurality of conductors; and an electrical connector that includes a plurality of fitting portions into which the respective plurality of inductors are configured to be fit into, the electrical connector being attached to an electrical connection holder, wherein each of the plurality of inductors includes a connection conductor that is configured to be fitted into a respective fitting portion of the plurality of fitting portions, and a magnetic core that surrounds each of the connection conductors in a state in which the magnetic core is attached to the electrical connection holder, and a respective connection conductor of the connection conductors and a respective conductor of the plurality of conductors are held by a connection holder in a state in which the respective connection conductor and the respective conductor are connected.

2. The conductive path with the noise filter according to claim 1, wherein the connection holder is integrated with the electrical connection holder and holds the respective connection conductor, the respective conductor of the plurality of conductors, a respective conductive path main body of the plurality of conductive path main bodies, and a respective insulating layer of the plurality of insulating layers all together.

3. The conductive path with the noise filter according to claim 1, wherein the connection holder includes a plurality of the connection holders that are integrated via a coupler.

* * * * *